United States Patent
Lin et al.

(10) Patent No.: US 12,336,212 B2
(45) Date of Patent: Jun. 17, 2025

(54) HIGH ELECTRON MOBILITY TRANSISTOR STRUCTURE AND METHOD OF MANUFACTURING THE SAME

(71) Applicant: GLOBALWAFERS CO., LTD., Hsinchu (TW)

(72) Inventors: Po-Jung Lin, Hsinchu (TW); Jia-Zhe Liu, Hsinchu (TW)

(73) Assignee: GLOBALWAFERS CO., LTD., Hsinchu (TW)

( * ) Notice: Subject to any disclaimer, the term of this patent is extended or adjusted under 35 U.S.C. 154(b) by 349 days.

(21) Appl. No.: 17/988,849

(22) Filed: Nov. 17, 2022

(65) Prior Publication Data

US 2023/0290872 A1 Sep. 14, 2023

(30) Foreign Application Priority Data

Mar. 14, 2022 (TW) .................................. 111109211

(51) Int. Cl.
*H10D 30/47* (2025.01)
*H10D 30/01* (2025.01)
(Continued)

(52) U.S. Cl.
CPC ....... *H10D 30/4755* (2025.01); *H10D 30/015* (2025.01); *H10D 62/221* (2025.01); *H10D 62/8503* (2025.01)

(58) Field of Classification Search
CPC ............. H10D 30/4755; H10D 30/015; H10D 62/221; H10D 62/8503; H10D 30/475;
(Continued)

(56) References Cited

U.S. PATENT DOCUMENTS

2015/0001582 A1 1/2015 Laboutin et al.
2015/0021660 A1* 1/2015 Chen .................. H10D 30/015
257/190

FOREIGN PATENT DOCUMENTS

JP 2010-182872 A 8/2010
JP 2011-35066 A 2/2011
TW 201342596 A 10/2013

OTHER PUBLICATIONS

Taiwanese Search Report for Taiwanese Application No. 111109211, dated Feb. 9, 2023, with an English translation.

* cited by examiner

*Primary Examiner* — Mohammad A Rahman
(74) *Attorney, Agent, or Firm* — Birch, Stewart, Kolasch & Birch, LLP

(57) ABSTRACT

An improved high electron mobility transistor (HEMT) structure includes a substrate, a nitride nucleation layer, a nitride buffer layer, a nitride channel layer, and a barrier layer. The nitride buffer layer includes a metal dopant. The nitride channel layer has a metal doping concentration less than that of the nitride buffer layer. A two-dimensional electron gas is formed in the nitride channel layer along an interface between the nitride channel layer and the barrier layer. A metal doping concentration X at an interface between the nitride buffer layer and the nitride channel layer is defined as the number of metal atoms per cubic centimeter, and a thickness Y of the nitride channel later is in microns (μm) and satisfies Y≤(0.2171)ln(X)−8.34, thereby reducing an influence of the metal dopant to a sheet resistance value of the nitride channel layer and providing the improved HEMT structure having a better performance.

8 Claims, 5 Drawing Sheets

(51) Int. Cl.
 *H10D 62/17* (2025.01)
 *H10D 62/85* (2025.01)
(58) Field of Classification Search
 CPC .... H10D 62/60; H10D 62/854; H10D 62/213; H10D 30/47
 See application file for complete search history.

HIGH ELECTRON MOBILITY TRANSISTOR STRUCTURE AND METHOD OF MANUFACTURING THE SAME

BACKGROUND OF THE INVENTION

Technical Field

The present invention relates generally to a semiconductor technology, and more particularly to a high electron mobility transistor.

Description of Related Art

A high electron mobility transistor (HEMT) is typically a transistor having a two-dimensional electron gas (2-DEG) that is located close to a heterojunction of two materials with different energy gaps. As the HEMT makes use of the 2-DEG having a high electron mobility as a carrier channel of the transistor instead of a doped region, the HEMT has features of a high breakdown voltage, the high electron mobility, a low on-resistance, and a low input capacitance, thereby could be widely applied to high power semiconductor devices.

In order to improve the performance of the HEMT, doping is generally performed on a buffer layer of HEMT. However, a dopant in the buffer layer would diffuse to a channel layer and cause a problem of increasing a sheet resistance value of the channel layer for example. Therefore, how to reduce the influence of the dopant to the sheet resistance value of the channel layer and provide a HEMT having a better performance is a problem needed to be solved in the industry.

BRIEF SUMMARY OF THE INVENTION

In view of the above, the primary objective of the present invention is to provide a high electron mobility transistor structure and a method of manufacturing the same, which could reduce an influence of a dopant to a sheet resistance value of a channel layer and provide a high electron mobility transistor having a better performance.

The present invention provides an improved high electron mobility transistor (HEMT) structure including a substrate, a nitride nucleation layer, a nitride buffer layer, a nitride channel layer, and a barrier layer, wherein the nitride buffer layer includes a metal dopant. The nitride channel layer having a metal doping concentration less than a metal doping concentration of the nitride buffer layer, wherein a two-dimensional electron gas is formed in the nitride channel layer along an interface between the nitride channel layer and the barrier layer. A metal doping concentration X at an interface between the nitride buffer layer and the nitride channel layer is defined as a number of metal atoms per cubic centimeter, and a thickness Y of the nitride channel layer is in micron (μm) and satisfies $Y \leq (0.2171)\ln(X) - 8.34$.

The present invention further provides a method of manufacturing a high electron mobility transistor (HEMT) structure including provide a substrate; form a nitride nucleation layer on a top of the substrate; form a nitride buffer layer on a top of the nitride nucleation layer and simultaneously perform a metal doping process; form a nitride channel layer having a thickness Y (in μm) on a top of the nitride buffer layer and stop the metal doping process; and form a barrier layer on a top of the nitride channel layer; wherein a metal doping concentration X of the nitride channel layer is defined as X number of metal atoms per cubic centimeter, and the thickness Y of the nitride channel layer satisfies $Y \leq (0.2171)\ln(X) - 8.34$.

The present invention further provides a method of manufacturing a high electron mobility transistor (HEMT) structure with a nitride channel layer having an optimum thickness and an optimum metal doping concentration including provide a substrate; form a nitride nucleation layer on a top of the substrate; form a nitride buffer layer on a top of the nitride nucleation layer and simultaneously perform a metal atom doping process; stop the metal atom doping process and form a nitride channel layer on a top of the nitride buffer layer; measure a metal concentration at an interface between the nitride buffer layer and the nitride channel layer, on a top surface of the nitride channel layer, and on different thicknesses of the nitride channel layer to obtain a plurality of metal doping concentration values, and calculate a change C in a metal doping concentration per unit thickness of the nitride channel layer based on the plurality of metal doping concentration values and the corresponding thicknesses of the nitride channel layer; and limit a metal doping concentration value between two metal doping concentration values X1 and X2 of the plurality of metal doping concentration values, thereby when a metal doping concentration at the interface between the nitride buffer layer and the nitride channel layer is X, and a thickness of the nitride channel layer is Y, and $X1 \leq X - C*Y \leq X2$ is satisfied, the optimum metal doping concentration and the corresponding thickness of the nitride channel layer are obtained.

With the aforementioned design, the influence of the metal dopant to the sheet resistance value of the nitride channel layer could be reduced and the improved HEMT structure having a better performance could be provided through the thickness Y of the nitride channel layer satisfying $Y \leq (0.2171)\ln(X) - 8.34$. When the metal doping concentration X is a constant, the maximum value of the thickness Y of the nitride channel layer could be calculated, thereby obtaining the optimum range of the thickness Y of the nitride channel layer corresponding to the metal doping concentration; or when the thickness Y of the nitride channel layer is a constant, the minimum value of the metal doping concentration X could be calculated, thereby obtaining the optimum range of the metal doping concentration corresponding to the thickness Y of the nitride channel layer. Additionally, through the method of manufacturing the HEMT structure with the nitride channel layer having the optimum thickness and the optimum metal doping concentration, the optimum metal doping concentration and the corresponding thickness of the nitride channel layer could be obtained.

BRIEF DESCRIPTION OF THE SEVERAL VIEWS OF THE DRAWINGS

The present invention will be best understood by referring to the following detailed description of some illustrative embodiments in conjunction with the accompanying drawings, in which.

DETAILED DESCRIPTION OF THE INVENTION

Figure 1:
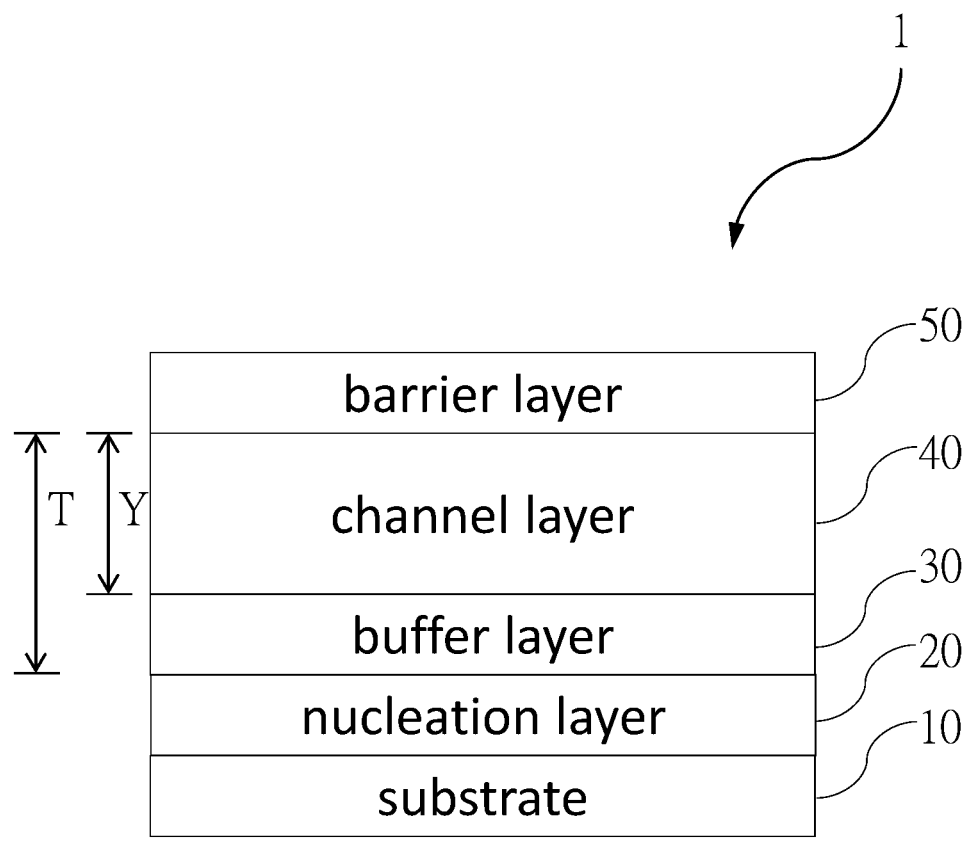
FIG. 1 is a schematic view showing the improved HEMT structure according to an embodiment of the present invention.

An improved high electron mobility transistor (HEMT) structure according to an embodiment of the present invention is illustrated in FIG. 1 and includes a substrate 10, a nucleation layer 20, a buffer layer 30, a channel layer 40, and a barrier layer 50 in order, and could be formed on the substrate 10 through metal organic chemical vapor deposition (MOCVD).

The substrate 10 is a substrate with a resistivity greater than or equal to 1000 § 0/cm, and could be a silicon carbide (SiC) substrate, a sapphire substrate, or a silicon (Si) substrate for example.

The nucleation layer 20 is a nitride nucleation layer made of aluminum nitride (AlN) or aluminum-gallium nitride (AlGaN), and is located between the substrate 10 and the buffer layer 30.

The buffer layer 30 includes a dopant. In the current embodiment, the buffer layer 30 is a nitride buffer layer made of gallium nitride as an example, and the dopant is a metal dopant, and more specifically iron as an example, wherein a dopant doping concentration of the buffer layer 30 is greater than or equal to $2\times10^{17}$ $cm^{-3}$, and a metal doping concentration of an interface between the buffer layer 30 and the channel layer 40 is greater than or equal to $2\times10^{17}$ $cm^{-3}$.

The channel layer 40 is a nitride channel layer made of aluminum-gallium nitride or gallium nitride as an example. A two-dimensional electron gas is formed in the channel layer 40 along an interface between the channel layer 40 and the barrier layer 50. In an embodiment, the buffer layer 30 and the channel layer 40 are respectively constituted by an identical and evenly distributed nitride, wherein a thickness Y of the channel layer 40 ranges between 0.6 μm and 1.2 μm, and a total thickness T of the buffer layer 30 and the channel layer 40 is less than or equal to 2 μm; a metal doping concentration, which is a concentration of iron atoms, of the channel layer 40 is less than that of the buffer layer 30 and gradually decreases in a direction from the interface between the buffer layer 30 and the channel layer 40 to the interface between the channel layer 40 and the barrier layer 50. In other embodiments, the concentration of iron atoms could be distributed in the buffer layer 30 and the channel layer 40 in a different way.

In an embodiment, the dopant doping concentration of the buffer layer 30 is evenly distributed on an identical thickness of the buffer layer 30, and a dopant doping concentration of the channel layer 40 is evenly distributed on an identical thickness of the channel layer 40, wherein the thickness of the buffer layer 30 is a distance from an interface between the buffer layer 30 and the nucleation layer 20 to a top surface of the buffer layer 30 or a distance of the buffer layer 30 extending from the interface between the buffer layer 30 and the nucleation layer 20 toward the channel layer 40, and the thickness Y of the channel layer 40 is a distance from the interface of the channel layer 40 and the buffer layer 30 to a top surface of the channel layer 40 or a distance of the channel layer 40 extending from the interface of the channel layer 40 and the buffer layer 30 toward the barrier layer 50. Preferably, a metal doping concentration of the buffer layer 30 on the identical thickness of the buffer layer 30 satisfies (a maximum value of the metal doping concentration of the buffer layer 30—a minimum value of the metal doping concentration of the buffer layer 30)/the maximum value of the metal doping concentration of the buffer layer 30≤0.2, and a metal doping concentration of the channel layer 40 on the identical thickness of the channel layer 40 satisfies (a maximum value of the metal doping concentration of the channel layer 40—a minimum value of the metal doping concentration of the channel layer 40)/the maximum value of the metal doping concentration of the channel layer 40≤0.2.

In the current embodiment, a dopant doping concentration of the channel layer 40 at the interface between the channel layer 40 and the barrier layer 50 is equal to or greater than $1\times10^{15}$ $cm^{-3}$. In another embodiment, the dopant doping concentration of the interface between the channel layer 40 and the barrier layer 50 could be equal to or greater than $1\times10^{16}$ $cm^{-3}$ and is less than or equal to $2\times10^{17}$ $cm^{-3}$.

A metal doping concentration X of the interface between the nitride buffer layer 30 and the nitride channel layer 40 is defined as the number of metal atoms per cubic centimeter. The thickness Y of the nitride channel layer 40 is in microns (μm) and satisfies Y≤(0.2171)ln(X)−8.34. Preferably, the thickness Y of the nitride channel layer 40 satisfies (0.2171)ln(X)−8.54≤Y. In this way, an influence of the metal dopant to a sheet resistance value of the nitride channel layer 40 could be reduced and the improved HEMT structure having a better performance could be provided. When the metal doping concentration X is a constant, a maximum value of the thickness Y of the nitride channel layer 40 could be calculated, thereby obtaining an optimum range of the thickness Y of the nitride channel layer 40 corresponding to the metal doping concentration X. When the thickness Y of the nitride channel layer 40 is a constant, a minimum value of the metal doping concentration X could be calculated, thereby obtaining an optimum range of the metal doping concentration corresponding to the thickness Y of the nitride channel layer 40.

Figure 2:
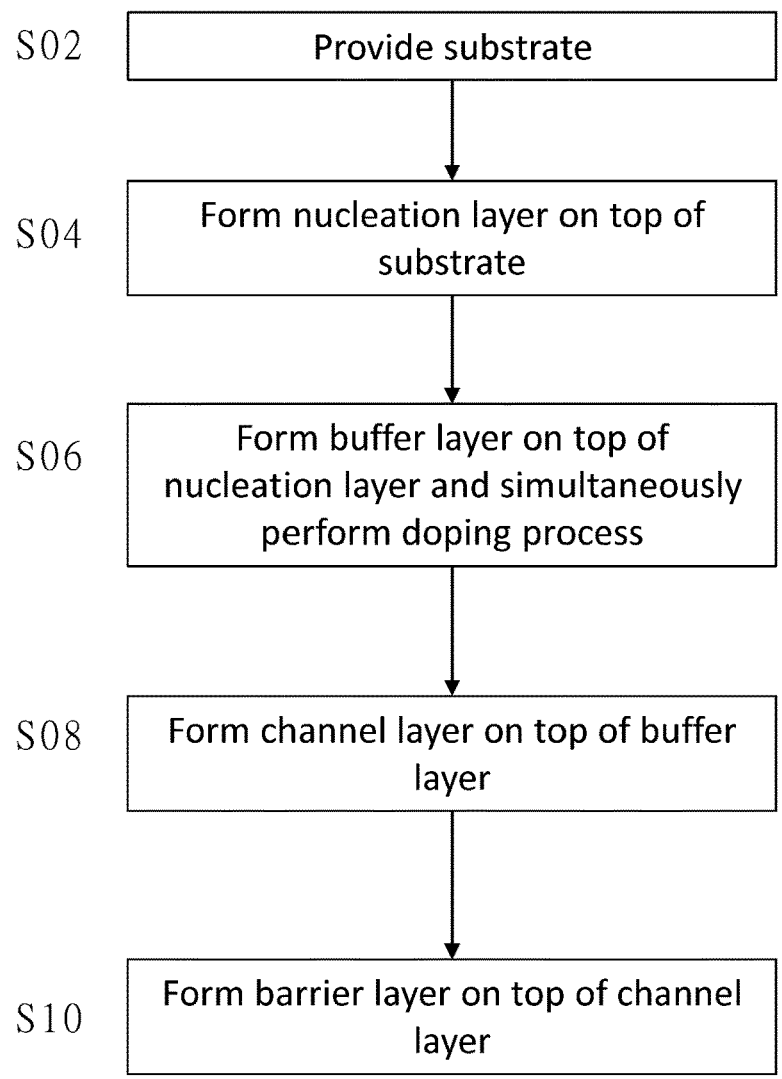
FIG. 2 is a flowchart of the method of manufacturing the HEMT structure according to an embodiment of the present invention.

A method of manufacturing a high electron mobility transistor (HEMT) structure according to an embodiment of the present invention is illustrated in a flowchart as shown in FIG. 2, and the HEMT structure of the present invention could be formed on a substrate through metal organic chemical vapor deposition (MOCVD). The method of manufacturing the HEMT structure includes following steps:

step S02: providing a substrate 10, wherein the substrate 10 is a substrate with a resistivity equal to or greater than 1000 Ω/cm; for example, the substrate 10 could be a SiC substrate, a sapphire substrate, or a Si substrate;

step S04: forming a nucleation layer 20 on a top of the substrate 10, wherein the nucleation layer 20 is aluminum nitride (AlN) or aluminum-gallium nitride (AlGaN);

step S06: forming a buffer layer 30 on a top of the nucleation layer 20 and simultaneously performing a doping process; the buffer layer 30 is a nitride buffer layer, wherein epitaxial growth conditions of the nitride buffer layer satisfy a temperature between 1030 degrees Celsius and 1070 degrees Celsius, a pressure between 150 torr and 250 torr, and a V/III ratio between 200 and 1500; a dopant doping concentration in the doping process is equal to or greater than $2\times10^{17}$ cm$^{-3}$, and a metal doped in the doping process is iron; the metal doping process includes controlling a flow rate of ferrocene (Cp$_2$Fe) at a constant, thereby obtaining the buffer layer 30 having a dopant doping concentration that is evenly distributed on an identical thickness of the buffer layer 30; preferably, a metal doping concentration of the buffer layer 30 on the identical thickness of the buffer layer 30 satisfies (a maximum value of the metal doping concentration of the buffer layer 30—a minimum value of the metal doping concentration of the buffer layer 30)/the maximum value of the metal doping concentration of the buffer layer 30≤0.2;

step S08: forming a channel layer 40 on a top of the buffer layer 30; the channel layer 40 is a nitride channel layer, wherein epitaxial growth conditions of the nitride channel layer satisfy a temperature between 1030 degrees Celsius and 1070 degrees Celsius, a pressure between 150 torr and 250 torr, and a V/III ratio between 200 and 1500; a metal doping concentration of an interface between the nitride buffer layer and the nitride channel layer is equal to or greater than $2\times10^{17}$ cm$^{-3}$; in the current embodiment, the step S08 includes stopping the metal doping process and forming the channel layer 40 having a thickness Y (in μm), wherein the thickness Y is a distance from the interface between the buffer layer 30 and the channel layer 40 to a top surface of the channel layer 40; a total thickness of the buffer layer 30 and the channel layer 40 is less than or equal to 2 μm and is a distance from an interface between the buffer layer 30 and the nucleation layer 20 to the top surface of the channel layer 40; iron atoms in the buffer layer 30 diffuse from the interface between the buffer layer 30 and the channel layer 40 to the channel layer 40, making an iron atom concentration in the channel layer 40 decrease gradually in a direction from the interface between the buffer layer 30 and the channel layer 40 to the top surface of the channel layer 40;

wherein a metal doping concentration X of the interface between the nitride buffer layer 30 and the nitride channel layer 40 is defined as X number of metal atoms per cubic centimeter, and the thickness Y of the nitride channel layer 40 satisfies Y≤(0.2171)ln(X)−8.34; preferably, the thickness Y of the nitride channel layer 40 satisfies (0.2171)ln(X)−8.54≤Y;

step S10: forming a barrier layer 50 on a top of the channel layer 40; a two-dimensional electron gas is formed in the channel layer 40 along an interface between the channel layer 40 and the barrier layer 50, wherein a dopant doping concentration of the channel layer 40 at the interface between the channel layer 40 and the barrier layer 50 is equal to or greater than $1\times10^{15}$ cm$^{-3}$; preferably, the dopant doping concentration of the channel layer 40 at the interface between the channel layer 40 and the barrier layer 50 is equal to or greater than $1\times10^{16}$ cm$^{-3}$ and is less than or equal to $2\times10^{17}$ cm$^{-3}$.

In the current embodiment, each of the buffer layer 30 and the channel layer 40 is constituted by evenly distributed gallium nitride, and a dopant doping concentration of the buffer layer 30 is evenly distributed on an identical thickness of the buffer layer 30, and a dopant doping concentration of the channel layer 40 is evenly distributed on an identical thickness of the channel layer 40. A thickness of the buffer layer 30 is a distance from an interface between the buffer layer 30 and the nucleation layer 20 to a top surface of the buffer layer 30 or a distance of the buffer layer 30 extending from an interface between the buffer layer 30 and the nucleation layer 20 toward the channel layer 40, the thickness Y of the channel layer 40 is a distance from the interface of the channel layer 40 and the buffer layer 30 to a top surface of the channel layer 40 or a distance of the channel layer 40 extending from the interface of the channel layer 40 and the buffer layer 30 toward the barrier layer 50. Preferably, a metal doping concentration of the buffer layer 30 on the identical thickness of the buffer layer 30 satisfies (a maximum value of the metal doping concentration of the buffer layer 30—a minimum value of the metal doping concentration of the buffer layer 30)/the maximum value of the metal doping concentration of the buffer layer 30≤0.2, and a metal doping concentration of the channel layer 40 on the identical thickness of the channel layer 40 satisfies (a maximum value of the metal doping concentration of the channel layer 40—a minimum value of the metal doping concentration of the channel layer 40)/the maximum value of the metal doping concentration of the channel layer 40≤0.2.

Figure 3:
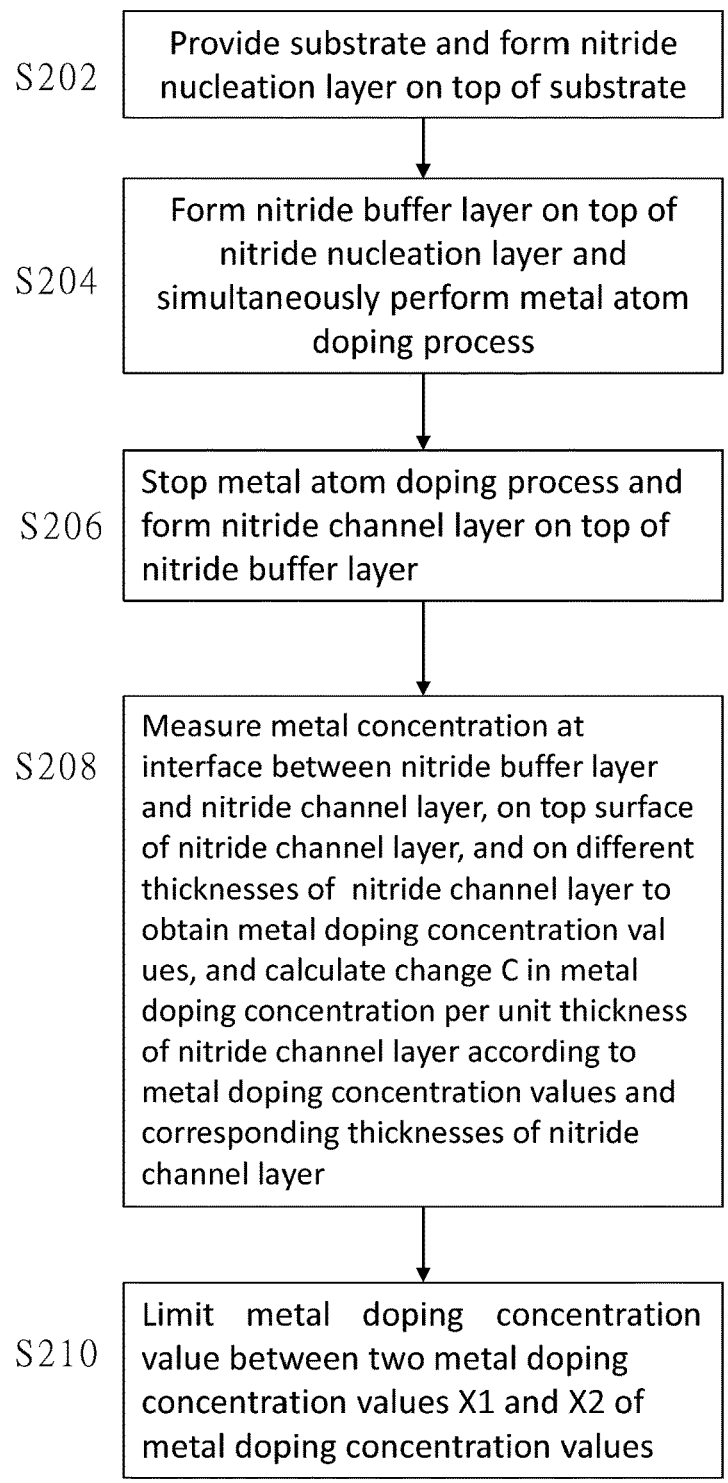
FIG. 3 is a flowchart of the method of manufacturing the HEMT structure with the nitride channel layer having the optimum thickness and the optimum metal doping concentration according to an embodiment of the present invention.

A method of manufacturing a high electron mobility transistor (HEMT) with a nitride channel layer having an optimum thickness and an optimum metal doping concentration is illustrated in FIG. 3 and includes following steps:

step S202: providing a substrate 10 and forming a nitride nucleation layer 20 on a top of the substrate 10;

step S204: forming a nitride buffer layer 30 on a top of the nitride nucleation layer 20 and simultaneously performing a metal atom doping process;

step S206: stopping the metal atom doping process and forming a nitride channel layer 40 on a top of the nitride buffer layer 30;

step S208: measuring a metal concentration at an interface between the nitride buffer layer 30 and the nitride channel layer 40, on a top surface of the nitride channel layer 40, and at different thicknesses of the nitride channel layer 40 to obtain a plurality of metal doping concentration values and calculating a change C in a metal doping concentration per unit thickness of the nitride channel layer 40 based on the metal doping concentration values and the corresponding thicknesses of the nitride channel layer 40;

step S210: limiting a metal doping concentration value between two metal doping concentration values X1 and X2 of the metal doping concentration values, thereby when a metal doping concentration of the nitride buffer layer 30 at the interface between the nitride buffer layer 30 and the nitride channel layer 40 is X, and a thickness of the nitride channel layer 40 is Y, and X1≤X−C*Y≤X2 is satisfied, the optimum metal doping concentration value and the corresponding thickness of the nitride channel layer could be obtained; the step S208 further includes measuring a sheet resistance value and a corresponding metal doping concentration on different thicknesses of the nitride channel layer 40 to obtain a plurality of sheet resistance values and a plurality of corresponding metal doping concentration values, and taking two distinct sheet resistance values of the sheet resistance values to obtain the two corresponding metal doping concentration values X1 and X2.

Figure 4:
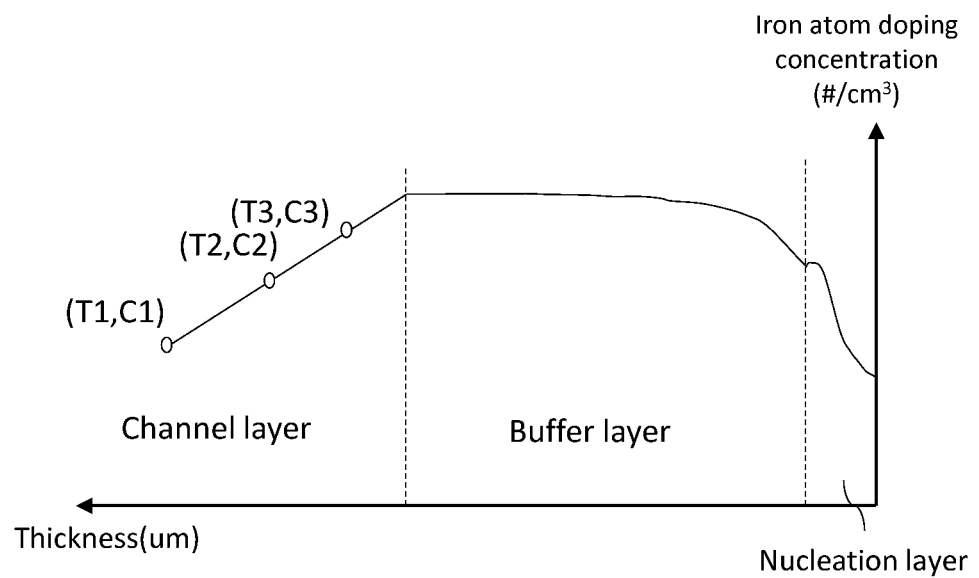
FIG. 4 is a schematic view showing a relationship between the iron atom doping concentration and the thickness according to the embodiment of the present invention.
Figure 5:
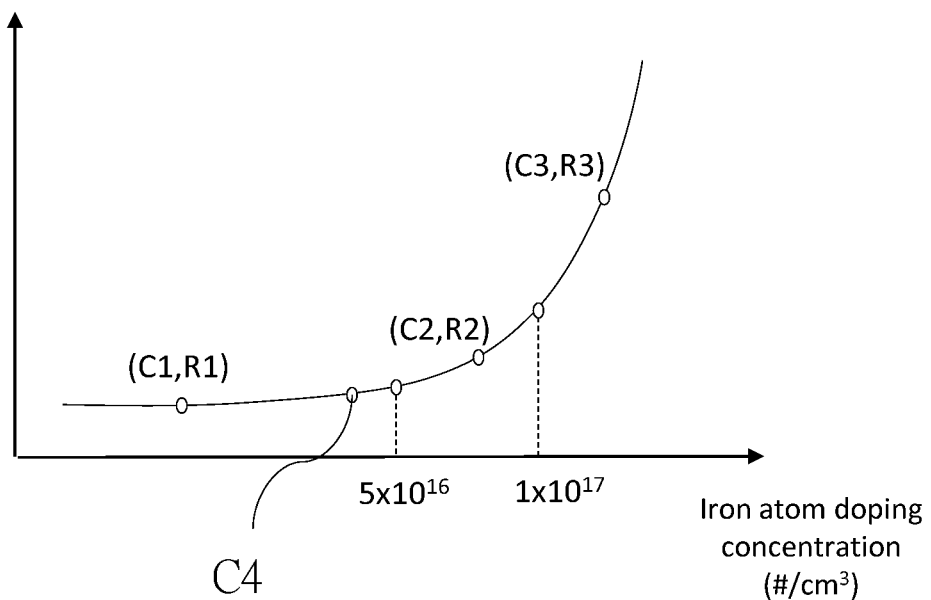
FIG. 5 is a schematic view showing a relationship between the sheet resistance value and the iron atom doping concentration according to the embodiment of the present invention.

For example, the step S202 is performed to provide a SiC substrate and to form an aluminum nitride nucleation layer on the substrate through metal organic chemical vapor deposition (MOCVD);

the step S204 is performed that a gallium nitride buffer layer is formed on a top of the aluminum nitride nucleation layer under epitaxial growth conditions of a temperature between 1030 degrees Celsius and 1070 degrees Celsius, a pressure between 150 torrs and 250 torrs, and a V/III ratio between 200 and 1500, which are satisfied through MOCVD, and an iron atom doping process is simultaneously performed, and at the same time a flow rate of ferrocene ($Cp_2Fe$) is controlled at a constant, making an iron atom doping concentration in the gallium nitride buffer layer a constant at $5\times10^{18}$ $cm^{-3}$;

then the step S206 is performed to stop the iron atom doping process and to form a gallium nitride channel layer, which has a thickness between 0.6 μm and 1.2 μm, on a top of the gallium nitride buffer layer under epitaxial growth conditions of a temperature between 1030 degrees Celsius and 1070 degrees Celsius, a pressure between 150 torrs and 250 torrs, and a V/III ratio between 200 and 1500, which are satisfied through MOCVD, wherein a total thickness of the gallium nitride buffer layer and the gallium nitride channel layer is less than or equal to 2 μm;

afterwards, the step S208 is performed; as shown in FIG. 4, iron atom doping concentration values C1, C2, and C3 respectively corresponding to different thicknesses T1, T2, and T3 of the gallium nitride channel layer are obtained, and a change C in a metal doping concentration per a unit thickness of the nitride channel layer is calculated; in the current embodiment, C=1/0.2171;

then, the step S210 is performed to obtain sheet resistance values R1, R2, and R3 respectively corresponding to the different thicknesses T1, T2, and T3 of the gallium nitride channel layer; as shown in FIG. 5, a regression curve is plotted by taking the sheet resistance values as a Y axis and the iron atom doping concentrations as a X axis; through the regression curve, when the iron atom doping concentration value is less than a fixed value C4, a change in the sheet resistance value approaches 0 while the iron atom doping concentration value decreases, and two distinct iron atom doping concentration values at $5\times10^{16}$ $cm^{-3}$ and $1\times10^{17}$ $cm^{-3}$ are correspondingly obtained near the fixed value C4; the iron atom doping concentration value is limited between the two distinct iron atom doping concentration values at $5\times10^{16}$ $cm^{-3}$ and $1\times10^{17}$ $cm^{-3}$; when a metal doping concentration of the gallium nitride buffer layer at the interface between the gallium nitride buffer layer and the gallium nitride channel layer is X, and a thickness of the gallium nitride channel layer is Y, and $5\times10^{16} \leq X - C*Y \leq 1\times10^{17}$ is satisfied, $(0.2171)\ln(X)-8.54 \leq Y \leq (0.2171)\ln(X)-8.34$ is deduced. In the current example, three different thickness values, iron atom doping concentration values, and sheet resistance values are taken as an example for illustration. In other embodiments, more than three thickness values, iron atom doping concentration values, and sheet resistance values are not limited.

With the aforementioned design, through satisfying $Y \leq (0.2171)\ln(X)-8.34$, the influence of the metal dopant to the sheet resistance value of the nitride channel layer could be reduced and an improved HEMT structure having a better performance could be provided. When the metal doping concentration X is a constant, the maximum value of the thickness Y of the nitride channel layer could be calculated, thereby obtaining the optimum range of the thickness of the nitride channel layer corresponding to the metal doping concentration. When the thickness Y of the nitride channel layer is a constant, the minimum value of the metal doping concentration X could be calculated, thereby obtaining the optimum range of the metal doping concentration corresponding to the thickness of the nitride channel layer. Additionally, as the dopant doping concentration of the channel layer at the interface between the channel layer and the barrier layer is equal to or greater than $1\times10^{15}$ $cm^{-3}$, the improved HEMT structure of the present invention could reduce the influence of the metal dopant to the sheet resistance value of the nitride channel layer and could provide the improved HEMT structure having a better performance.

It must be pointed out that the embodiments described above are only some preferred embodiments of the present invention. All equivalent structures and methods which employ the concepts disclosed in this specification and the appended claims should fall within the scope of the present invention.

What is claimed is:

1. An improved high electron mobility transistor (HEMT) structure, comprising in order:
    a substrate;
    a nitride nucleation layer;
    a nitride buffer layer comprising a metal dopant;
    a nitride channel layer having a metal doping concentration less than a metal doping concentration of the nitride buffer layer; and
    a barrier layer, wherein a two-dimensional electron gas is formed in the nitride channel layer along an interface between the nitride channel layer and the barrier layer;
    wherein a metal doping concentration X at an interface between the nitride buffer layer and the nitride channel layer is defined as a number of metal atoms per cubic centimeter, and a thickness Y of the nitride channel layer is in microns (μm) and satisfies $Y \leq (0.2171)\ln(X)-8.34$.

2. The improved HEMT structure as claimed in claim 1, wherein the thickness Y of the nitride channel layer satisfies $(0.2171)\ln(X)-8.54 \leq Y$.

3. The improved HEMT structure as claimed in claim 1, wherein a metal doping concentration of the nitride buffer layer on an identical thickness of the nitride buffer layer is evenly distributed and satisfies (a maximum value of the metal doping concentration of the nitride buffer layer—a minimum value of the metal doping concentration of the nitride buffer layer)/the maximum value of the metal doping concentration of the nitride buffer layer≤0.2; a metal doping concentration of the nitride channel layer on an identical thickness of the nitride channel layer is evenly distributed and satisfies (a maximum value of the metal doping concentration value of the nitride channel layer—a minimum value of the metal doping concentration value of the nitride channel layer)/the maximum value of the metal doping concentration value of the nitride channel layer≤0.2.

4. The improved HEMT structure as claimed in claim 1, wherein the nitride channel layer is constituted by an evenly distributed nitride.

5. The improved HEMT structure as claimed in claim 1, the nitride buffer layer and the nitride channel layer are respectively constituted by an identical nitride.

6. The improved HEMT structure as claimed in claim 1, wherein a metal doping concentration of the nitride channel layer gradually decreases in a direction from the interface between the nitride buffer layer and the nitride channel layer to an interface between the nitride channel layer and the barrier layer.

7. The improved HEMT structure as claimed in claim 1, wherein the metal doping concentration X at the interface between the nitride channel layer and the nitride buffer layer is equal to or greater than $2\times10^{17}$ $cm^{-3}$.

8. The improved HEMT structure as claimed in claim 1, wherein a total thickness of the nitride buffer layer and the nitride channel layer is less than or equal to 2 μm.

* * * * *